United States Patent
Whitted

(10) Patent No.: US 8,016,126 B1
(45) Date of Patent: Sep. 13, 2011

(54) CABINET STRUCTURES RESISTANT TO RACKING DEFORMATION FOR RACK MOUNTED COMPUTING SYSTEMS

(75) Inventor: William H. Whitted, Palo Alto, CA (US)

(73) Assignee: Google Inc., Mountain View, CA (US)

( * ) Notice: Subject to any disclaimer, the term of this patent is extended or adjusted under 35 U.S.C. 154(b) by 267 days.

(21) Appl. No.: 12/348,157

(22) Filed: Jan. 2, 2009

Related U.S. Application Data

(63) Continuation of application No. 10/677,107, filed on Sep. 30, 2003, now abandoned.

(51) Int. Cl.
*A47G 7/00* (2006.01)
(52) U.S. Cl. .............. 211/26; 211/41.17; 312/223.1; 312/265.1
(58) Field of Classification Search .......... 211/26; 312/265.1, 265.3, 265.4, 257.1, 223.1, 223.2; 52/630; 174/50, 58; 361/683, 684
See application file for complete search history.

(56) References Cited

U.S. PATENT DOCUMENTS

| | | | |
|---|---|---|---|
| 1,996,518 A | 4/1935 | Levene et al. | |
| 3,543,464 A | 12/1970 | Taylor | |
| 3,819,246 A | 6/1974 | List | |
| 3,843,222 A | 10/1974 | Berkun | |
| 4,497,411 A | 2/1985 | DeBortoli | |
| 4,736,566 A | 4/1988 | Krotsch | |
| 5,020,866 A * | 6/1991 | McIlwraith | 312/265.4 |
| 5,202,818 A * | 4/1993 | Betsch et al. | 361/829 |
| 5,619,837 A | 4/1997 | DiSanto | |
| 5,673,985 A | 10/1997 | Mitchell | |
| 5,675,952 A | 10/1997 | French | |
| 5,806,946 A | 9/1998 | Benner et al. | |
| 5,897,180 A | 4/1999 | Singer | |
| 6,062,664 A | 5/2000 | Benner | |
| 6,149,255 A | 11/2000 | Benner et al. | |
| 6,202,860 B1 | 3/2001 | Ludwig | |
| 6,580,030 B1 | 6/2003 | Horne | |
| 6,605,777 B1 | 8/2003 | Anderson et al. | |

* cited by examiner

*Primary Examiner* — Blair M. Johnson
(74) *Attorney, Agent, or Firm* — Fish & Richardson P.C.

(57) ABSTRACT

Cabinet structures resistant to racking deformation for rack mount computing systems are disclosed. The cabinet structure may generally include a first and a second side wall each extending between a front side and a rear side. The first side wall includes a first front corner post, a first rear corner post, and two first rails each extending between the first corner posts, at least one of the first rails being a first angled rail having a first angled face with a first outer edge and a first recessed edge recessed from an exterior surface of the first corner posts relative to the first outer edge, the first angled face further having two first end edges each extending between the first outer and recessed edges, the two first end edges being at an angle less than 90° relative to the exterior surface of the first corner posts and being substantially attached to the first corner posts. The second side wall may include a second front corner post and a second rear corner post.

18 Claims, 4 Drawing Sheets

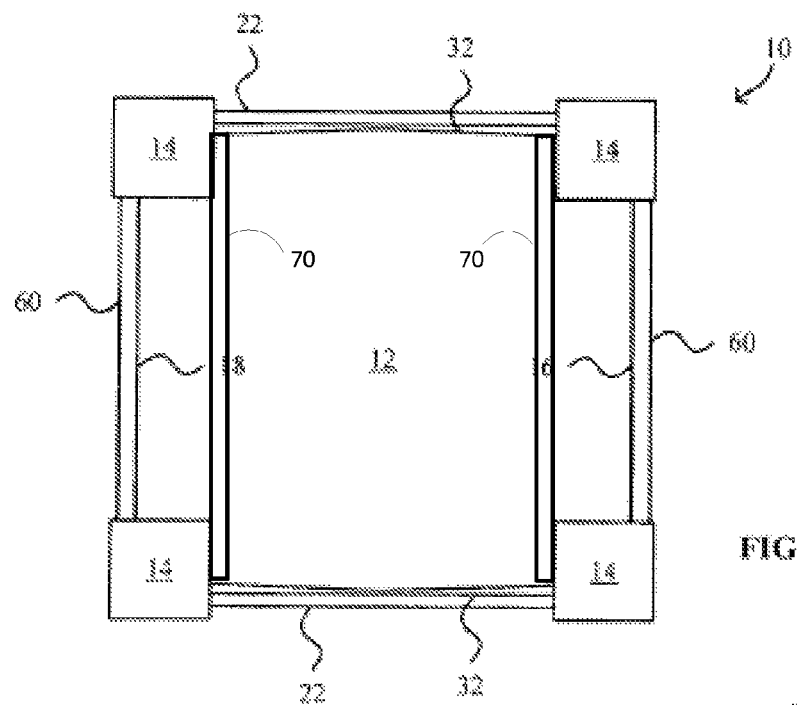
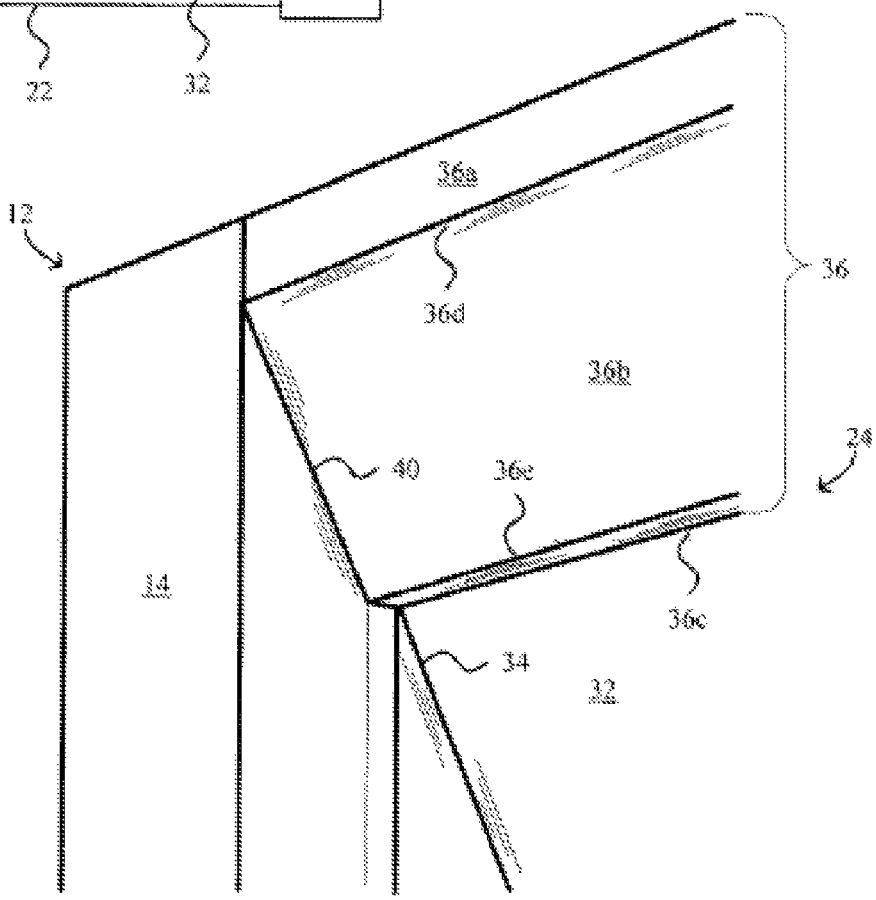
FIG. 2
FIG. 3

CABINET STRUCTURES RESISTANT TO RACKING DEFORMATION FOR RACK MOUNTED COMPUTING SYSTEMS

CLAIM OF PRIORITY

This application is a continuation application under 35 U.S.C. §120 of U.S. patent application Ser. No. 10/677,107, filed Sep. 30, 2003 now abandoned. The entire contents of U.S. patent application Ser. No. 10/677,107 is incorporated by reference as if fully set forth herein.

BACKGROUND OF THE INVENTION

1. Field of the Invention

The present invention relates generally to rack mount computer systems. More specifically, cabinet structures resistant to racking deformation for rack mount computing systems are disclosed.

2. Description of Related Art

Many of today's more complex computing systems such as computer server systems are often rack-mounted systems in which a number of removable electronics modules, such as electronics trays, are positioned and stacked relative to each other in a shelf-like manner within a frame or rack. Rack-mounted Systems allow the arrangement of several of the electronics modules in a vertical orientation for efficient use of space. Each electronics module can be slid into and out of the rack-mounting system. Typically, the electronics modules are inserted from the front of the rack and various cables such as data cables, power cables, etc., are connected to the electronics modules at the front and/or rear of the rack.

Each electronics module may correspond to a different server or each electronics module may hold one or more components of a server. Examples of electronics modules include modules for processing, storage such as random access memory (RAM), network interfaces and controllers, disk drives such as floppy disk drives, hard drives, compact disk (CD) drives, and digital video disk (DVD) drives, parallel and serial ports, small computer systems interface (SCSI) bus controllers, video controllers, power supplies, and so forth. A server farm in today's computing environment may include numerous racks that hold various types of computer-related modules.

For maintenance and other purposes, it is often desired to remove an entire electronics module from the rack for servicing and then return the module to the rack. Oftentimes, the remainder of the server system is still in operation while maintenance is performed on a particular module or a particular component within the module. For example, when a component on a particular electronics tray is to be serviced or replaced, a service technician would need to remove the particular electronics tray from the server rack and then remove the server component from the electronics tray. In order to minimize system downtime and to reduce the effect of maintenance on the system's overall operation, the rack should provide fast and convenient access to the electronics module.

A typical rack includes four support columns forming the four corners of the rack. Pairs of opposing shelf supports or slide assemblies are attached to the columns to support the stack of electronics modules. The rack is often left open in the front and back sides in order to provide fast and convenient visual and physical access to the electronics modules by the service technician. In particular, for the service technician to gain full access to a given electronics module, the electronics module is slid forward away from the stack of remaining electronics modules in the rack. The rack can be optionally enclosed on the remaining two sides with side walls extending between each of the two pairs of the support columns.

Server racks or cabinets are typically U-sized where U is a standard unit of measure defined to be 1.75 inches by the Electronics Industries Alliance (EIA) for designating the height in computer enclosures and rack cabinets. Electronics modules contained within the server racks generally have a height in multiples of U's, for example, 1 U corresponds to a height of 1.75 inches, 2 U 3.5 inches, 3 U 5.25 inches. Typically the electronics modules mounted into most electronics racks are in the form of 1 U to 8 U boxes. Each box will have provisions for mounting it securely to the rack. The mounting is usually available at the front of the rack and often at the rear of the rack as well. When properly installed in the rack, each of the several electronics modules in the rack acts as an independent stiffener and helps in maintaining the rack's structural integrity and in aiding its resistance to racking forces.

However, in order to provide easier, faster, more convenient and yet cost effective access to the electronics modules for repair, maintenance and/or upgrade, some electronics modules may not provide the secure mounting mechanisms that help to stiffen the rack and thus maintain the rack's structural integrity and provide resistance to racking forces. Rather, these electronics modules may rely on an open and/or unsecured structure to enable an easily removable electronics module. As the electronics modules themselves may not be stiff and may not be securely mounted to the rack, the electronics modules may not contribute much, if any, resistance to racking.

Thus, it would be desirable to provide systems and methods for reducing the racking deformation of the rack mount computing system.

SUMMARY OF THE INVENTION

Cabinet structures resistant to racking deformation for rack mount computing systems are disclosed. It should be appreciated that the present invention can be implemented in numerous ways, including as a process, an apparatus, a system, a device, or a method. Several inventive embodiments of the present invention are described below.

The cabinet structure may generally include a first and a second side wall each extending between a front side and a rear side. The first side wall includes a first front corner post, a first rear corner post, and two first rails each extending between the first corner posts, at least one of the first rails being a first angled rail having a first angled face with a first outer edge and a first recessed edge recessed from an exterior surface of the first corner posts relative to the first outer edge, the first angled face further having two first end edges each extending between the first outer and recessed edges, the two first end edges being at an angle less than 90° relative to the exterior surface of the first corner posts and being substantially attached to the first corner posts. The second side wall may include a second front corner post and a second rear corner post.

According to another embodiment, the cabinet structure may include four support corners defining a front side, a rear side, a first side, and a second side, each side extending between a corresponding pair of the four support corners and a first side wall. The first side wall may be disposed on the first side and may include at least two first rails extending between the corresponding pair of the support corners, at least one of the first rails being an angled first rail having an angled face with a first exterior edge and a first interior edge recessed from the first side relative to the first exterior edge, the first angled face further having two end edges each extending between the first exterior edge and the first interior edge, the two first end edges being at an angle less than 90° relative to the first side and being substantially attached to the corresponding pair of the support corners. The first end edges may be attached to the support corners via weld joints, bolts, screws, and/or adhesives. The cabinet structure may also include a second side wall disposed on the second side of the frame structure that is similarly configured as the first side wall.

The first side may include three first rails including a middle rail and two angled first rails. The middle rail may also be an angled rail. The cabinet structure may further include a panel extending between and attached to the two first rails and the support corners. The panel may define diagonal creases such that a peripheral region of the panel is recessed relative to a central region of the panel. A crossbar may be provided on the front and/or rear sides extending between the corresponding pair of support corners.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements.

FIG. 2 is a cross sectional view of the frame structure taken across line 2-2 in FIG. 1.

FIG. 3 is a partial side perspective view illustrating an angled upper left corner of an upper portion of the cabinet structure of FIG. 1 in more detail.

DESCRIPTION OF SPECIFIC EMBODIMENTS

Cabinet structures resistant to racking deformation for rack mount computing systems are disclosed. The following description is presented to enable any person skilled in the art to make and use the invention. Descriptions of specific embodiments and applications are provided only as examples and various modifications will be readily apparent to those skilled in the art. The general principles defined herein may be applied to other embodiments and applications without departing from the spirit and scope of the invention. Thus, the present invention is to be accorded the widest scope encompassing numerous alternatives, modifications and equivalents consistent with the principles and features disclosed herein. For purpose of clarity, details relating to technical material that is known in the technical fields related to the invention have not been described in detail so as not to unnecessarily obscure the present invention.

Figure 1:
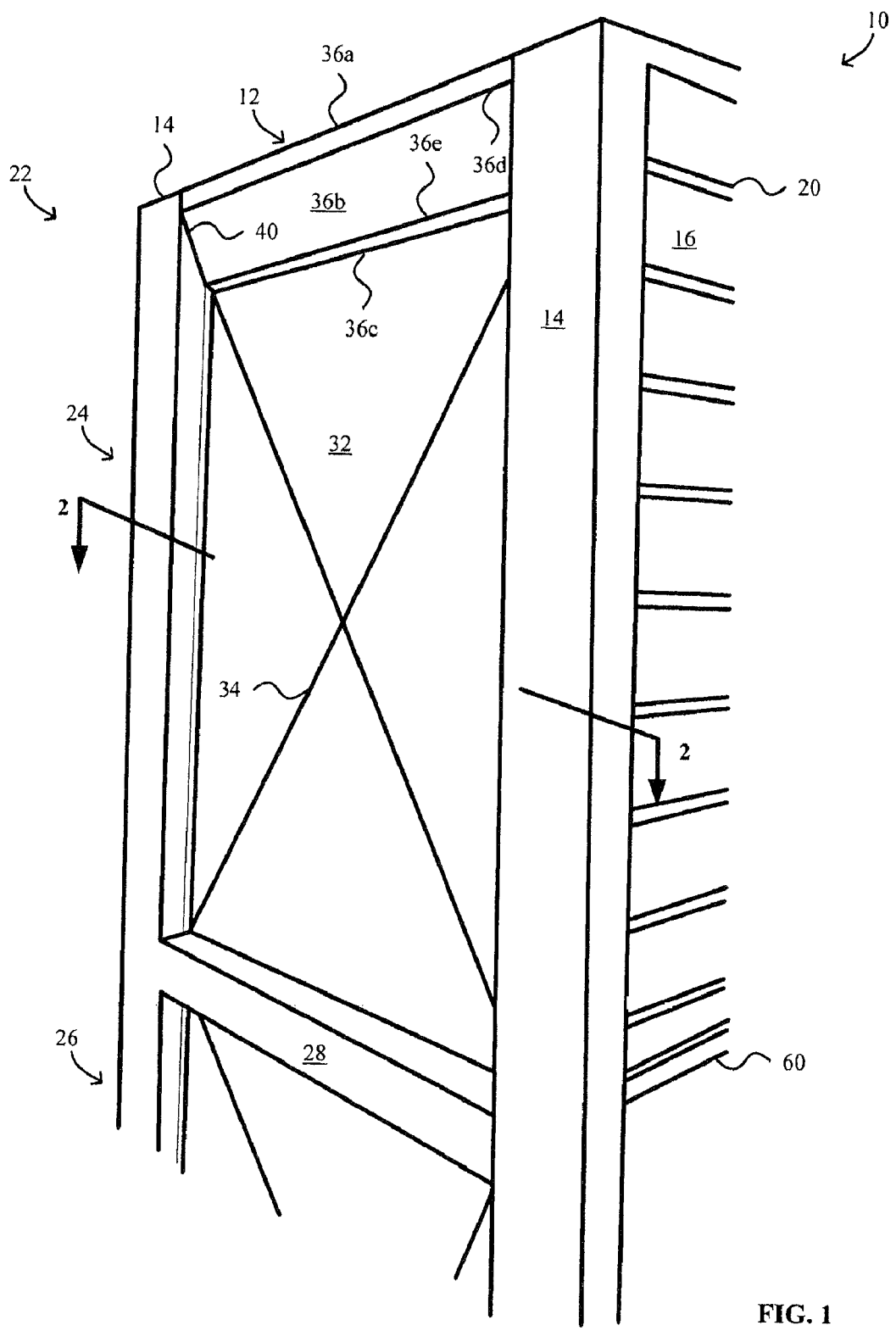
FIG. 1 is a partial side perspective view of a rack mount computing system having a cabinet or frame structure.

FIG. 1 is a partial front perspective view of a rack mount computing system 10 having a cabinet or frame structure or rack 12. FIG. 2 is a cross sectional view of the 5 frame structure 12 taken across line 2-2 in FIG. 1. The frame structure 12 typically includes four corners, columns or posts 14 forming the four corners of the frame structure 12 and defining four sides. The frame structure 12 preferably also includes a fixed top and a fixed bottom shelf. Two opposing sides, namely, a front side 16 and a back side 18 may be open to provide fast and convenient visual and physical access to electronics 10 modules 20 contained within the frame structure 12 to service technicians. The remaining two opposing left and right sides may include left and right side walls 22 to, for example, keep cooling air in the frame structure 12 from leaking out the sides. The support columns 14 and/or side walls 22 may provide surfaces on which to mount pairs of opposing shelf supports 70, slide assemblies, or any other suitable support structure to support the stack of electronics modules 20. To gain full access to a particular electronics module, the service technician would slide the particular electronics module forward and away from the stack of remaining electronics modules 20.

As noted above, in order to provide easier, faster, more convenient and yet cost effective access to the electronics modules 20 for repair, maintenance and/or upgrade, the electronics modules 20 may not provide secure mounting mechanisms that secure the electronics modules 20 to the cabinet structure 12, help to stiffen the cabinet structure 12, maintain the structural integrity of the cabinet structure 12, and/or provide resistance to racking forces. Rather, these electronics modules 20 may rely on an open and/or unsecured structure to enable an easily removable electronics module 20. As the electronics modules themselves may not be stiff and may not be securely mounted to the cabinet structure 12, the electronics modules 20 may not contribute much, if any, resistance to racking across the open front and back sides of the cabinet structure 12.

Due to the open and unsecured structure of the electronics modules 20 and the cabinet structure 12, the cabinet structure 12 may suffer from racking deformation particularly when the rack mount system is moved. In essence, the conventional frame structure resembles a large but short open rectangular tube with little or no structural support across its open faces. Racking deformation as used herein generally refers to deformation where the rectangular cross section of the rectangular tube deforms to become a parallelogram in which the angles between adjacent sides are no longer at 90° relative to each other.

To help reduce the racking deformation across the open front and back sides of the cabinet structure 12, each side wall 22 is configured to provide additional structural support to help prevent racking deformation. In the example shown and described herein, the side wall 22 has an upper portion 24 (shown in perspective in FIG. 1) and a lower portion 26 separated by a middle rail section 28 typically housing electrical or power devices and/or connections. FIG. 3 is a partial side perspective view illustrating an angled upper left corner 30 of the upper portion 24 of the cabinet structure 12 in more detail. It is noted that although hidden from view, an angled upper right corner is preferably similarly provided and can simply be implemented as a mirror image of the angled upper left corner 30.

As shown, each of the upper and lower portions includes a panel 32 recessed inwards from the corresponding support columns 14. The panel 32 may be crimped or otherwise slightly bent to result in creases 34 diagonally across the panel. The creases 34 may be such that the panel 32 generally extends slightly outwardly toward the center of the panel 32. In other words, the creases 34 may be such that a peripheral region of the panel 32 is generally recessed relative to a central region of the panel 32. The diagonal creases 34 helps to increase the stiffness of the panel 32 and thereby help prevent the panel 32 from rattling and/or flexing during use.

Along the top of the upper side wall portion 24, i.e., opposite the middle rail section 28, the upper side wall portion 24 includes a top rail section 36 extending between the corresponding pair of support columns 14. The top rail section 36 has a vertical portion 36a, an angled face 36b, and a smaller horizontal projection 36c, all extending between the corresponding pair of support columns 14. The vertical portion 36a is in line with (extends from) an outside surface of the support columns 14. The angled face 36b has an outside edge 36d that is connected to the vertical portion 36a and that is also in line with the outside surface of the support columns 14. The angled face 36b also has an inside edge 36e that is recessed from the outside surface of the support columns 14 and is connected to the smaller horizontal projection 36c. The smaller horizontal projection 36c in turn extends between the inside edge 36e of the angled face 36b and the panel 32.

The angled face 36b is attached at its end edges to the corresponding pair of support columns 14 at joint 40. As is evident, by angling the face 36b of the top rail section 36, longer weld joints 40 between the top rail section 36 and the corresponding pair of support columns 14 can be achieved. Because the frame structure 12 is typically made of a metal, welding is a common connection mechanism. However, any other suitable connection mechanism may be utilized such as adhesives and mechanism fasteners including rivets, screws, bolts and so forth. In particular, without the angled face 36b, the vertical portion 36a and the horizontal projection 36c would simply be extended until they meet at an approximately 90° corner. The weld joint would thus only be along the side edges of the horizontal projection 36c that meets the support columns 14. In contrast, by providing the angled face 36b, the length of the weld joint is increased and the amount of the increase depends on the particular configuration. For example, the angle of the angled face 36b relative to the support column 14, i.e., relative to the vertical, may be any suitable angle less than approximately 60°, or more preferably approximately 15°-45° or any other suitable angle. In one embodiment, the angle is approximately 30°. With an angle of 30°, the length of the weld is approximately twice than without the angled face 36b.

Figure 4:
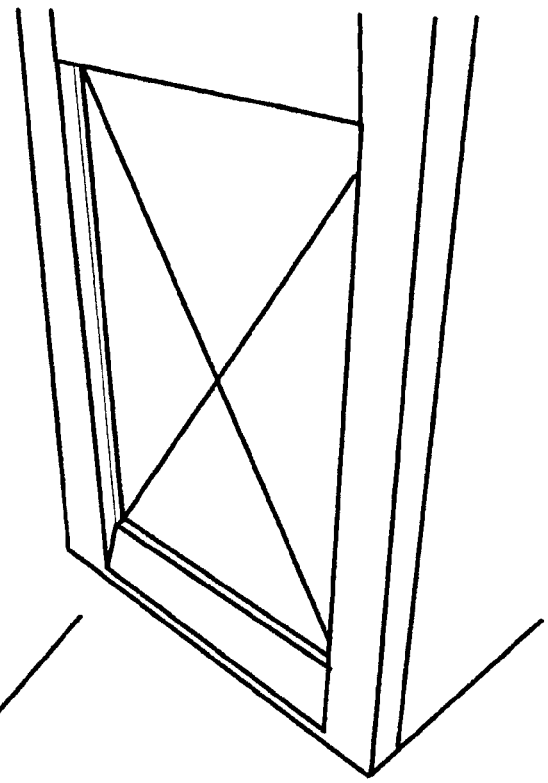
FIG. 4 is a partial side perspective view illustrating a lower portion of the cabinet structure of FIG. 1 in more detail.
Figure 5:
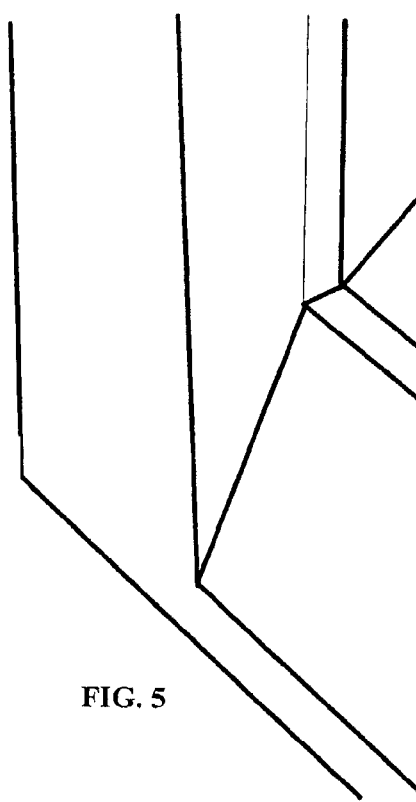
FIG. 5 is partial side perspective view of an angled lower left corner of the cabinet structure of FIG. 1 in more detail.

The bottom of the lower side wall portion 26 is similarly configured with an angled face as the top of the upper side wall portion 24. In particular, FIG. 4 is a partial side perspective view illustrating the lower portion 26 of the cabinet structure 12 and FIG. 5 is partial side perspective view of an angled lower left corner 50 the lower portion 26 of the cabinet structure 12 FIG. 4 in more detail. It is noted that although hidden from view, an angled lower right corner is preferably similarly provided and can simply be implemented as a mirror image of the angled lower left corner 50. In addition, as the details, features, and functionality of the angled lower left corner 50 are similar to the angled upper left corner 30 described above, those details are not repeated for purposes of clarity.

In the examples shown in FIGS. 1-5, only the top of the upper side wall portion 24 and the bottom of the lower side wall portion 26 are configured with rail sections with angled faces. However, it is to be understood that the bottom of the upper side wall portion 24 and the top of the lower side wall portion 26 may be similarly configured with rail sections with angled faces. As an example, such features may be integrated into the middle rail section 28 or may be separately implemented.

Figure 6:
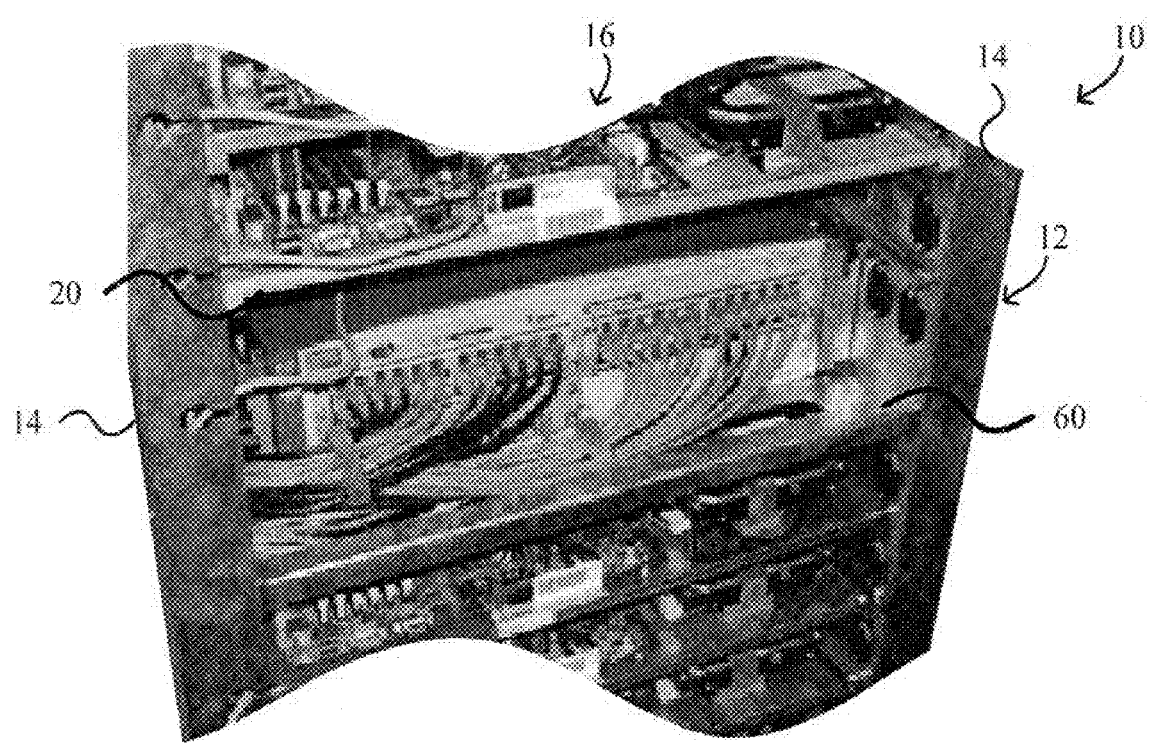
FIG. 6 is a partial front perspective view illustrating a crossbar or handle of the cabinet structure of FIG. 1 in more detail.

To further help reduce racking deformation, a crossbar or handle extending between a pair of the support columns may be provided across the front and/or back sides. FIG. 6 is a partial front perspective view illustrating a crossbar or handle 60 of the cabinet structure 12. Preferably, the crossbar 60 is generally parallel to the electronics modules 20, i.e., perpendicular to the support columns 14. The crossbar 60 can also serve as a handle bar to facilitate the service technician in moving the rack system as needed. If both the front and the back crossbars 60 are provided, they are preferably positioned directly opposite each other, i.e., at the same height, so as to minimize the number of electronics modules whose access may be obstructed as a result of the crossbars 60. In one embodiment, the Ethernet switch of the rack system may be mounted behind the crossbars 60 to a relative short, e.g., 3 U conventional Electronics Industries Alliance (EIA) mounting strip. As the Ethernet switch electronics module is rarely removed as most of its internal parts are mounted on cards that are removable over the crossbars 60 with the Ethernet switch electronics module in place. Even the Ethernet switch electronics module does need to be removed, the electronics module above the Ethernet switch may be removed and then the Ethernet switch may be lifted above the crossbars 60 and removed from the cabinet structure 12. In addition, the Ethernet switch is relatively deep and the space behind it may be kept empty or may be utilized to store the rack's main power cords such as during shipping.

The handle 60 may be secured to the columns defining the front side via, for example, welding and/or any suitable mechanical fasteners. The handles 60 may be removable (e.g., screwed in place) to further allow access to the electronics module blocked by the handles.

As noted above, racks typically have casters mounted so as to provide mobility as racks sometimes need to be moved, whether during installation, reconfiguration, testing, or for regular servicing. However, due to the open front and back sides, typical frame structures or racks suffer from racking deformation particularly when the rack mount system is moved. As is evident, the concepts presented herein help to reduce such racking deformation without any or without significant impact on the service technician's access to the electronics modules. It is noted that the various components of the embodiments described herein, although separately described, may be integrally formed.

While the preferred embodiments of the present invention are described and illustrated herein, it will be appreciated that they are merely illustrative and that modifications can be made to these embodiments without departing from the spirit and scope of the invention. Thus, the invention is intended to be defined only in terms of the following claims.

What is claimed is:

1. A frame structure for a rack mount computer system comprising:
   a set of four vertical support posts defining a computer rack having an interior volume between the vertical support posts, with a first pair of vertical support posts located at opposed sides of the computer rack and defining a first rack face, and each of the first pair of vertical support posts having a vertical planar side surface facing the other vertical support post;
   a top rail coupled between, and shorter in length than, the first pair of vertical support posts, the top rail defining along its length a pair of opposed rail faces and a pair of opposed rail edges joining the pair of opposed faces, the opposed rail faces and opposed rail edges each located between the two vertical support posts;
   an outer face distinct from the pair of opposed to rail faces, and substantially coplanar with the first rack face of the computer rack, the outer face being connected along its length to one of the opposed rail edges;

a cross member disposed between the first pair of vertical support posts and coupled to corresponding interior edge surfaces of the vertical support posts; and a side panel having perimeter edges adjacent the interior edge surfaces of the first pair of vertical support posts and the to rail, the perimeter edges secured to the vertical support posts such that the side panel is recessed from the first rack face, wherein a first edge of the pair of opposed edges is positioned substantially closer to the first rack face of the computer rack than the second edge of the pair of opposed edges, so that the top rail resists twisting of the computer rack about a vertical axis through the computer rack and a horizontal axis through the computer rack, and wherein the top rail includes two opposed ends, each of the opposed ends being fixedly attached directly to the vertical planar surface of one of the first pair of vertical support posts, so that connection joints are defined between the opposed ends and the first pair of vertical support posts and between the first and second edges of the pair of opposed edges, the connection joints connecting the top rail to the vertical support posts and angled with respect to the vertical axis and the horizontal axis.

2. The frame structure of claim 1 wherein the cross member is flush with the first rack face.

3. The frame structure of claim 1, wherein the perimeter edges are further secured to at least one of the top rail or the cross member.

4. The frame structure of claim 3, wherein the side panel is a quadrilateral side panel comprising creases extending between opposing diagonal corners of the side panel.

5. The frame structure of claim 2, wherein the computer rack defines an external perimeter in the form of a rectilinear box, and the top rail is mounted entirely inside the rectilinear box.

6. The frame structure of claim 1 further comprising a second pair of adjacent vertical support posts defining a second rack face, the second rack face comprising an aperture allowing access to the interior volume of the frame structure.

7. The frame structure of claim 6 further comprising a plurality of rack supports extending along at least a portion of the first rack face between the first pair of vertical support posts within the interior volume, each rack support secured to at least one vertical support post within the first pair of vertical support posts, the rack supports adapted to support one or more electronics modules within at least a portion of the interior volume.

8. The frame structure of claim 7, wherein a vertical distance between adjacent rack supports comprises a multiple of a U standard unit of measure.

9. The frame structure of claim 1, wherein the top rail is coupled to the first pair of vertical support posts via a weld joint, the weld joint extending along an interface between the vertical support posts of the first pair of vertical support posts and the opposed rail faces of the top rail.

10. The frame structure of claim 2, the top rail coupled to a top end of each of the vertical support posts in the first pair of vertical support posts, the frame structure further comprising a base rail coupled to a bottom end of each of the vertical support posts in the first pair of vertical support posts opposite the top end, the base rail shorter in length than the vertical support posts.

11. The frame structure of claim 10, the base rail defining along its length a pair of opposed rail faces and a pair of opposed rail edges joining the pair of opposed faces, the opposed rail faces and opposed rail edges of the base rail each located between the two vertical support posts, wherein a first edge of the pair of opposed edges of the base rail is positioned substantially closer to the first rack face of the computer rack than the second edge of the pair of opposed edges of the base rail, so that the base rail resists twisting of the computer rack about the vertical axis through the computer rack and the horizontal axis through the computer rack.

12. The frame structure of claim 10, further comprising a bottom side panel disposed within an aperture defined by the interior edge surfaces of the first pair of vertical support posts, the base rail, and the cross member, the bottom side panel detachably secured to at least one of the vertical support posts, the base rail, and the cross member.

13. The frame structure of claim 10, wherein the base rail is coupled to the first pair of vertical support posts via a weld joint, the weld joint extending along an interface between the vertical support posts of the first pair of vertical support posts and the opposed rail faces of the bottom rail.

14. The frame structure of claim 1 further comprising a top shelf coupled to at least one of the top rail and a vertical support post at the top end of the vertical support post.

15. The frame structure of claim 10 further comprising a bottom shelf coupled to at least one of the base rail and a vertical support post at the bottom end of the vertical support post.

16. The frame structure of claim 1, wherein the top rail comprises a flat structural member.

17. The frame structure of claim 1, wherein the connection joints are formed by weld joints.

18. The frame structure of claim 1, wherein the top rail further comprises an outer face that is distinct form the pair of opposed top rail faces, and that is parallel to the first rack face of the computer rack, the outer face being connected along its length to one of the rail edges.

* * * * *

UNITED STATES PATENT AND TRADEMARK OFFICE
CERTIFICATE OF CORRECTION

| | | |
|---|---|---|
| PATENT NO. | : 8,016,126 B1 | Page 1 of 1 |
| APPLICATION NO. | : 12/348157 | |
| DATED | : September 13, 2011 | |
| INVENTOR(S) | : William H. Whitted | |

It is certified that error appears in the above-identified patent and that said Letters Patent is hereby corrected as shown below:

On column 6, line 66, in Claim 1, delete "to" and insert --top--, therefor.

On column 7, line 8, in Claim 1, delete "to rail," and insert --top rail--, therefor.

On column 8, line 36, in Claim 14, delete "claim 1" and insert --claim 10--, therefor.

On column 8, line 48, in Claim 18, delete "form" and insert --from--, therefor.

Signed and Sealed this
Twenty-fifth Day of October, 2011

David J. Kappos
*Director of the United States Patent and Trademark Office*